United States Patent [19]

Nagasaka et al.

[11] Patent Number: 5,607,817
[45] Date of Patent: Mar. 4, 1997

[54] PHOTOPOLYMERIZABLE COMPOSITION

[75] Inventors: Hideki Nagasaka, Yamato; Masaaki Tsuchiyama, Machida; Toshiyuki Urano, Yokohama, all of Japan

[73] Assignee: Mitsubishi Chemical Corporation, Tokyo, Japan

[21] Appl. No.: 292,755

[22] Filed: Aug. 18, 1994

Related U.S. Application Data

[63] Continuation of Ser. No. 962,104, Oct. 16, 1992, abandoned.

[30] Foreign Application Priority Data

Oct. 18, 1991 [JP] Japan ..................... 3-271363

[51] Int. Cl.$^6$ .................. G03C 1/73; G03F 7/028
[52] U.S. Cl. .............. 430/281.1; 430/916; 430/920; 430/926; 522/24; 522/25; 522/26
[58] Field of Search .................. 430/281, 920, 430/916, 292, 926, 281.1; 522/26, 25, 24

[56] References Cited

U.S. PATENT DOCUMENTS

| | | | |
|---|---|---|---|
| 3,987,037 | 10/1976 | Bonham et al. | 260/240 D |
| 4,505,793 | 3/1985 | Tamoto et al. | 430/920 |
| 4,594,310 | 6/1986 | Nagasaka | 522/26 |
| 4,886,735 | 12/1989 | Boettcher et al. | 430/281 |
| 4,962,011 | 10/1990 | Aldag et al. | 430/292 |
| 4,966,830 | 10/1990 | Nagasaka et al. | 430/281 |

FOREIGN PATENT DOCUMENTS

| | | |
|---|---|---|
| 0107792 | 5/1984 | European Pat. Off. |
| 0138187 | 4/1985 | European Pat. Off. |
| 0291881 | 11/1988 | European Pat. Off. |

*Primary Examiner*—Janis L. Dote
*Attorney, Agent, or Firm*—Oblon, Spivak, McClelland, Maier & Neustadt, P.C.

[57] ABSTRACT

A photopolymerizable composition comprising an addition polymerizable compound having at least one ethylenically unsaturated double bond and a photopolymerization initiator system, wherein the photopolymerization initiator system comprises:

(a) a sensitizer of the formula (I)

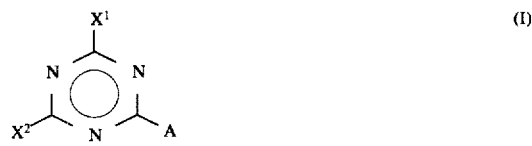

wherein -A is

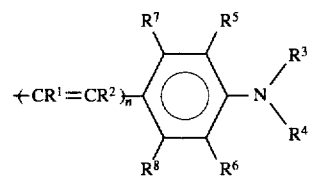

wherein each of $R^1$ and $R^2$ is a hydrogen atom, an alkyl group, an aryl group or a halogen atom, each of $R^3$ and $R^4$ is an alkyl group which may have substituents, each of $R^5$ to $R^8$ is a hydrogen atom, an alkyl group or an alkoxy group, or $R^3$ and $R^4$, $R^3$ and $R^5$ and/or $R^4$ and $R^6$ bond to each other to form a ring structure, and n is 0, 1 or 2; and each of $X^1$ and $X^2$ is -A as defined above, an alkyl group, an aralkyl group, an aryl group, a heterocyclic group, an alkoxy group, an aryloxy group, a carboalkoxy group, an amino group or a vinyl group; and (b) at least one active agent capable of generating active radicals when irradiated in the co-existence of the sensitizer.

12 Claims, No Drawings

PHOTOPOLYMERIZABLE COMPOSITION

This application is a Continuation of application Ser. No. 07/962,104, filed on Oct. 16, 1992, now abandoned.

FIELD OF THE INVENTION

The present invention relates to a photopolymerizable composition. Particularly, it relates to a photopolymerizable composition showing a very high sensitivity to light rays in a visible light range.

BACKGROUND OF THE INVENTION

Heretofore, a number of image forming methods have been known in which a photopolymerizing system is utilized. For example, there are a method wherein a photopolymerizable composition comprising an addition polymerizable compound containing an ethylenic double bond and a photopolymerization initiator, and optionally as an additional component an organic polymer binder, is prepared, this photopolymerizable composition is coated on a substrate to obtain a photosensitive material provided with a layer of the photopolymerizable composition, exposure of a desired image is conducted so that the exposed portion is polymerized and cured, and the unexposed portion is then dissolved and removed to form a cured relief image; a method wherein a layer of a photopolymerizable composition is formed between a pair of substrates, at least one of which is transparent, image exposure is conducted from the transparent substrate side so that a change in the bonding strength is created by the radiation, and then the substrate is peeled off to form an image; and a method wherein an image is formed by utilizing a change in the adhesion of a toner caused by radiation to a layer of a photopolymerizable composition. As the photopolymerization initiator of the photopolymerizable composition used in these methods, benzoin, benzoin alkyl ether, benzil ketal, benzophenone, anthraquinone, benzil or Michler's ketone has been employed. These photopolymerization initiators have an ability to initiate photopolymerization with light rays of short wavelength in the ultraviolet light range of at most 400 nm. However, their ability to initiate polymerization is poor with light rays in the visible light range of more than 400 nm. This poor ability has restricted the applicable range of photopolymerizable compositions containing them.

In recent years, with the progress of image-forming techniques, there has been a strong demand for photopolymers highly sensitive to light rays in the visible light range. Such photopolymers are photosensitive materials suitable for use in e.g. non-contact type projection exposure plate making or in laser plate making by means of a visible light laser. Among these techniques, a plate making system using an oscillation beam of 488 nm of an argon ion laser is considered to be one of the most prospective techniques for the future.

There have been some proposals for a photopolymerizable material containing a photopolymerization initiator system sensitive to light rays in the visible light range. For example, there have been proposed a system comprising a hexaarylbiimidazole, a radical-generating agent and a dye (Japanese Examined Patent Publication No. 37377/1970), a system comprising a hexaarylbiimidazole and a (p-dialkylaminobenzylidene)ketone (Japanese Unexamined Patent Publications No. 2528/1972 and No. 155292/1979), a system comprising a cyclic cis-α-dicarbonyl compound and a dye (Japanese Unexamined Patent Publication No. 84183/1973), a system comprising a substituted triazine and a merocyanine dye (Japanese Unexamined Patent Publication No. 151024/1979), a system comprising ketocumalin and an active agent (Japanese Unexamined Patent Publications No. 112681/1977, No. 15503/1983 and No. 88005/1985), a system comprising a substituted triazine and a sensitizer (Japanese Unexamined Patent Publications No. 29803/1983 and No. 40302/1983), a system comprising biimidazole, a styrene derivative and thiol (Japanese Unexamined Patent Publication No. 56403/1984), a system comprising an organic peroxide and a dye (Japanese Unexamined Patent Publications No. 140203/1984 and No. 189340/1984) and a s-triazine compound having a trihalomethyl group and a styryl group as a photopolymerization initiator effective with visible lights by itself (Japanese Examined Patent Publication No. 1281/1984).

These conventional techniques are certainly useful by visible light rays. However, they have a difficulty such that the sensitivity is not so high and is still inadequate from the practical viewpoint.

SUMMARY OF THE INVENTION

The present inventors have conducted extensive studies to overcome such a difficulty and to obtain an excellent photopolymerizable composition and as a result, have found that in a photopolymerizable composition comprising at least an addition polymerizable compound having at least one ethylenic double bond and a photopolymerization initiator system, when the photopolymerization initiator system contains a sensitizer of a s-triazine derivative having at least one specific structure and at least one active agent capable of generating active radicals when irradiated in the coexistence of the sensitizer, the sensitivity and the practical usefulness can be improved. The present invention has been accomplished on the basis of this discovery.

Namely, it is an object of the present invention to provide a photopolymerizable composition highly sensitive to visible light rays, particularly to light rays with a long wavelength of 488 nm.

Another object of the present invention is to provide a photopolymerizable composition which makes high speed plate making possible even by means of a low output laser such as an air-cooled argon laser in a case of laser plate making using an argon ion laser.

A further object of the present invention is provide a photopolymerizable composition which makes the plate making operation remarkably advantageous from the viewpoint of costs and time.

Such objects of the present invention can be readily accomplished by a photopolymerizable composition comprising an addition polymerizable compound having at least one ethylenically unsaturated double bond and a photopolymerization initiator system, wherein the photopolymerization initiator system comprises:

(a) a sensitizer of the formula (I)

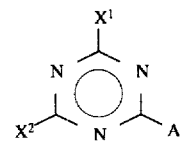

wherein -A is

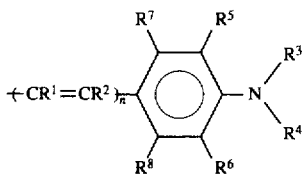

wherein each of $R^1$ and $R^2$ is a hydrogen atom, an alkyl group, an aryl group or a halogen atom, each of $R^3$ and $R^4$ is an alkyl group which may have substituents, each of $R^5$ to $R^8$ is a hydrogen atom, an alkyl group or an alkoxy group, or $R^3$ and $R^4$, $R^3$ and $R^5$ and/or $R^4$ and $R^6$ bond to each other to form a ring structure, and n is 0, 1 or 2; and each of $X^1$ and $X^2$ is —A as defined above, an alkyl group, an aralkyl group, an aryl group, a heterocyclic group, an alkoxy group, an aryloxy group, a carboalkoxy group, an amino group or an unsubstituted vinyl group; and (b) at least one active agent capable of generating active radicals when irradiated in the co-existence of the sensitizer.

DETAILED DESCRIPTION OF THE INVENTION AND PREFERRED EMBODIMENTS THEREOF

Now, the present invention will be described in detail with reference to the preferred embodiments.

The addition polymerizable compound having at least one ethylenically unsaturated double bond (hereinafter referred to simply as "ethylenic compound") contained as a first essential component in the photopolymerizable composition of the present invention is a compound having an ethylenically unsaturated double bond, which is capable of undergoing addition polymerization and being cured by the action of the photopolymerization initiator system as a second essential component, when the photopolymerizable composition is irradiated with active light rays. For example, it may be a monomer having such a double bond or a polymer having an ethylenically unsaturated double bond in its side chain or main chain. In the present invention, the monomer is meant for a substance as opposed to a so-called polymer substance and includes dimers, trimers and oligomers in addition to monomers in a narrow sense.

The monomer having an ethylenically unsaturated double bond includes, for example, an unsaturated carboxylic acid, an ester of an unsaturated carboxylic acid with an aliphatic polyhydroxy compound, an ester of an unsaturated carboxylic acid with an aromatic polyhydroxy compound and an ester obtained by the esterification reaction of an unsaturated carboxylic acid and a polybasic carboxylic acid with a polyhydroxy compound such as the above-mentioned aliphatic polyhydroxy compound or aromatic polyhydroxy compound.

The above-mentioned ester of an unsaturated carboxylic acid with an aliphatic polyhydroxy compound is not particularly limited and includes, as specific examples, acrylic acid esters such as ethylene glycol diacrylate, triethylene glycol diacrylate, trimethylolpropane triacrylate, trimethylolethane triacrylate, pentaerythritol diacrylate, pentaerythritol triacrylate, pentaerythritol tetracrylate, dipentaerythritol tetracrylate, dipentaerythritol pentacrylate, dipentaerythritol hexacrylate and glycerol acrylate; methacrylic acid esters corresponding to the above examples wherein "acrylate" is changed to "methacrylate"; itaconic acid esters corresponding to the above examples wherein "acrylate" is likewise changed to "itaconate"; crotonic acid esters corresponding to the above examples wherein "acrylate" is likewise changed to "crotonate"; and maleic acid esters corresponding to the above examples wherein "acrylate" is likewise changed to "maleate".

The ester of an unsaturated carboxylic acid with an aromatic polyhydroxy compound includes, for example, hydroquinone diacrylate, hydroquinone dimethacrylate, resorcinol diacrylate, resorcinol dimethacrylate and pyrogallol triacrylate.

The ester obtained by the esterification reaction of an unsaturated carboxylic acid and a polybasic carboxylic acid with a polyhydroxy compound may not necessarily be a single compound. Typical specific examples include a condensation product of acrylic acid, phthalic acid and ethylene glycol, a condensation product of acrylic acid, maleic acid and diethylene glycol, a condensation product of methacrylic acid, terephthalic acid and pentaerythritol and a condensation product of acrylic acid, adipic acid, butane diol and glycerol.

Other ethylenic compounds which may be used in the present invention include, for example, acrylamides such as ethylene bisacrylamide; allyl esters such as diallyl phthalate; and vinyl group-containing compounds such as divinyl phthalate.

The polymer having an ethylenically unsaturated double bond on the main chain includes, for example, a polyester obtained by the polycondensation reaction of an unsaturated dibasic carboxylic acid with a dihydroxy compound, and a polyamide obtained by the polycondensation reaction of an unsaturated dibasic carboxylic acid with a diamine. The polymer having an ethylenically unsaturated double bond at the side chain may be a condensation polymer of a dibasic carboxylic acid having an unsaturated bond at the side chain such as itaconic acid, propylidenesuccinic acid or ethylidenemalonic acid with a dihydroxy or diamine compound. Further, a polymer having a functional group having a reactivity such as a hydroxyl group or a halogenated methyl group in the side chain, such as a polymer obtained by a polymer reaction of e.g. polyvinyl alcohol, poly(2-hydroxyethyl methacrylate) or polyepichlorohydrin with an unsaturated carboxylic acid such as acrylic acid, methacrylic acid or crotonic acid, may also be suitable for use.

Among the above-mentioned ethylenic compounds, monomers of acrylic acid esters or methacrylic acid esters are particularly suitable for use.

Now, the photopolymerization initiator system as a second essential component of the photopolymerizable composition of the present invention will be described.

The photopolymerization initiator system of the present invention is a combination of two components. The first component is a sensitizer of a s-triazine derivative of the formula (I) represented as component (a) in the present invention. Among three substituents of the s-triazine derivative, at least one is the above-mentioned substituent -A having a p-aminophenyl structure. Now, the s-triazine derivative of the formulation (I) will be described in further detail. The derivative has a structure in which at least one dialkylaminophenyl group shown by the above —A is bonded to the s-triazine ring directly or preferably via one or two double bonds, and the alkyl groups $R^3$ and $R^4$ substituted on the above amino group, may have substituents. As such substituents, substituents harmless to the photopolymerization reaction, such as a phenyl group, a cyano group and an alkoxy group, may be mentioned. Halogen atoms are excluded, since they have a photo reactivity and are thus harmful. On the other hand, $R^3$ and $R^4$ may bond to substituents $R^5$ and $R^6$, respectively, on the phenyl group to form a tetrahydroquinoline ring structure or a julolidine ring structure. Otherwise, $R^3$ and $R^4$ may bond to each other to form a ring structure together with the nitrogen atom. Among three positions for substitution on the s-triazine, a position not substituted by the above-mentioned dialkylaminophenyl derivative of the formula —A, may be substituted by an alkyl group, an aryl group, a heterocyclic group, an aralkyl group, an alkoxy group, an aryloxy group, a carboalkoxy group, an amino group or an unsubstituted vinyl group.

Typical examples of the s-triazine compound of the formula (I) will be given below, but it should be understood that the s-triazine compound useful in the present invention is by no means restricted to such specific examples. In the following examples, in A, n=1 and each of $R^1$, $R^2$, $R^5$, $R^6$, $R^7$ and $R^8$ is a hydrogen atom, unless otherwise indicated. Further, when $R^3$ and $R^5$ together form the following structure:

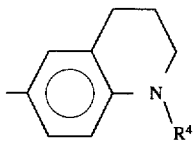

such will be represented by "$R^3$ and $R^5$: tetrahydroquinoline ring". When $R^3$, $R^4$, $R^5$ and $R^6$ together form the following structure:

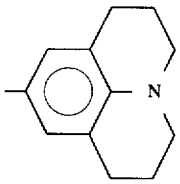

such will be represented by "$R^3$, $R^4$, $R^5$ and $R^6$: julolidine ring". When $R^3$ and $R^4$ together form the following structure:

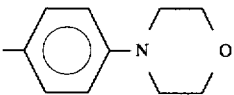

such will be represented by "$R^3$ and $R^4$: morpholino ring".

Typical Examples of the Compound of the Formula (I)

(a-1) $X^1$ and $X^2$: methyl groups, $R^3$ and $R^4$: ethyl groups (a-2) $X^1$: methyl group, $X^2$: phenyl group, $R^3$ and $R^4$: ethyl groups (a-3) $X^1$ and $X^2$: methyl groups, $R^3$ and $R^5$: tetrahydroquinoline ring, $R^4$: benzyl group (a-4) $X^1$ and $X^2$: phenyl groups, $R^3$ and $R^5$: tetrahydroquinoline ring, $R^4$: methyl group (a-5) $X^1$ and $X^2$: methyl groups, $R^3$, $R^4$, $R^5$ and $R^6$: julolidine ring (a-6) $X^1$ and $X^2$: phenyl groups, $R^3$, $R^4$, $R^5$ and $R^6$: julolidine ring (a-7) $X^1$ and $X^2$: phenyl groups, $R^3$ and $R^4$: benzyl groups (a-8) $X^1$ and $X^2$: phenyl groups, $R^3$ and $R^4$: ethyl groups (a-9) $X^1$ and $X^2$: benzyl groups, $R^3$, $R^4$, $R^5$ and $R^6$: julolidine ring (a-10) $X^1$ and $X^2$: β-naphthyl groups, $R^3$, $R^4$, $R^5$ and $R^6$: julolidine ring (a-11) $X^1$ and $X^2$: ethyl groups, $R^1$: methyl group, $R^3$, $R^4$, $R^5$ and $R^6$: julolidine ring (a-12) $X^1$ and $X^2$: p-chlorophenyl groups, $R^3$, $R^4$, $R^5$ and $R^6$: julolidine ring (a-13) $X^1$ and $X^2$: p-methoxyphenyl groups, $R^3$, $R^4$, $R^5$ and $R^6$: julolidine ring (a-14) $X^1$ and $X^2$: pyridyl groups, $R^3$, $R^4$, $R^5$ and $R^6$: julolidine ring (a-15) $X^1$ and $X^2$: ethoxy groups, $R^3$ and $R^4$: morpholino ring (a-16) $X^1$ and $X^2$: ethoxycarbonyl groups

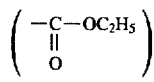

$R^3$: 2-cyanoethyl group, $R^4$: methyl group (a-17) $X^1$ and $X^2$: amino groups, $R^3$: 2-methoxyethyl group, $R^4$: ethyl group, $R^8$: methyl group (a-18) n=2, $X^1$ and $X^2$: methyl groups, $R^3$, $R^4$, $R^5$ and $R^6$: julolidine ring (a-19) n=2, $X^1$ and $X^2$: phenyl groups, $R^3$, $R^4$, $R^5$ and $R^6$: julolidine ring (a-20) n=2, $X^1$ and $X^2$: phenyl groups, $R^3$ and $R^4$: methyl groups (a-21) $X^1$: methyl group, $X^2$: A, $R^3$ and $R^4$: ethyl groups (a-22) $X^1$: methyl group, $X^2$: A, $R^3$, $R^4$, $R^5$ and $R^6$: julolidine ring (a-23) $X^1$ and $X^2$: A, $R^3$ and $R^4$: ethyl groups (a-24) $X^1$ and $X^2$: A, n=0, $R^3$ and $R^4$: methyl groups (a-25) $X^1$ and $X^2$: A, $R^3$, $R^4$, $R^5$ and $R^6$: julolidine ring.

Among these sensitizers, preferred are those wherein the dialkylaminophenyl group in the substituent —A is a tetrahydroquinoline ring, particularly preferably a julolidine ring.

The method for preparing the above-described sensitizer of the present invention is not particularly limited. However, the sensitizer can be synthesized usually by firstly preparing a methyl-s-triazine derivative and then condensing e.g. a dialkylaminobenzaldehyde thereto using a base or an acid as a catalyst.

The second component constituting the photopolymerization initiator system of the present invention is an active agent capable of generating active radicals when irradiated in the coexistence of the above-described sensitizer, which is represented as component (b) in the present invention. This active agent may be of any type so long as it has a nature of forming active radicals as a result of a certain reaction with the sensitizer when excited by light. Preferred active agents include, for example, a hexaarylbiimidazole, a halogenated hydrocarbon derivative, an organic thiol compound and a diaryliodonium salt.

Specific examples of the hexaarylbiimidazole include 2,2'-bis(o-chlorophenyl)-4,4',5,5'-tetraphenylbiimidazole (hereinafter referred to simply as b-1),2,2'-bis (o-bromophenyl)-4,4',5,5'-tetraphenylbiimidazole (hereinafter referred to simply as b-2),2,2'-bis(o,p-dichlorophenyl)-4,4',5,5'-tetraphenylbiimidazole, 2,2'-bis (o-chlorophenyl)-4,4',5,5'-tetra(p-carboethoxyphenyl)-biimidazole (hereinafter referred to simply as b-3), 2,2'-bis(o,o'-dichlorophenyl)4,4'-5,5'-tetraphenylbiimidazole, 2,2'-bis(o-nitrophenyl)-4,4',5,5'-tetraphenylbiimidazole and 2,2'-bis(o-methylphenyl)-4,4',5,5'-tetraphenylbiimidazole.

The halogenated hydrocarbon derivative includes, for example, 2,4,6-tris(trichloromethyl)-s-triazine (hereinafter referred to simply as b-4), 2,4,6-tris(tribromomethyl)-s-triazine, 2-methyl-4,6-di (trichloromethyl)-s-triazine, 2-(p-methoxyphenyl)-4,6-di(trichloromethyl)-s-triazine, 2,2,2-trichloromethylacetophenone, tribromomethylphenylsulfone and 2-trichloromethyl-5-(p-methoxystyryl)-1,3,4-oxadiazole.

The organic thiol compound includes, for example, 2-mercaptobenzthiazole (hereinafter referred to simply as b-5), 3-mercaptobenzoxazole, 2-mercaptobenzimidazole, 2-mercapto-4(3H)-quinazolinone and β-mercaptonaphthaline.

The aryliodonium salt includes, for example, diphenyliodonium hexafluorophosphate (hereinafter referred to simply as b-6), diphenyliodonium tosylate, diphenyliodonium fluoroborate, diphenyliodonium hexafluoroarsenate, diphenyliodonium chloride and ditolyliodonium hexafluorophosphate.

As the active agent in the present invention, known agents other than those mentioned above, including, for example, a ketoxime ester such as 3-benzoyloxyiminobutan-2-one, an organic peroxide such as 3,3',4,4'-tetra(t-butylperoxycarbonyl)benzophenone (hereinafter referred to simply b-7), N-phenylglycine and dimedone, may also be employed. Among these active agents, a system containing a hexaarylbiimidazole is preferred.

There is no particular restriction as to the amounts of the sensitizer and the active agent constituting the photopolymerization initiator system to be used for the photopolymerization composition of the present invention. However, it is usually preferred to employ from 0.05 to 20 parts by weight, more preferably from 0.2 to 10 parts by weight, of the sensitizer, and from 0.5 to 70 parts by weight, more preferably from 1 to 30 parts by weight, of the active agent, per 100 parts by weight of the ethylenic compound.

The photopolymerizable composition of the present invention may further contain an organic polymer substance as a binder in addition to the above-described various components, to modify the composition or to improve the physical properties after the photocuring. Such a binder is suitably selected depending upon the purpose of improvement such as the compatibility, the film-forming properties, the developing properties or the adhesive properties. Specifically, for example, for the purpose of improving the aqueous-system developing properties, an acrylic acid copolymer, a methacrylic acid copolymer, an itaconic acid copolymer, a partially esterified maleic acid copolymer, an acidic cellulose modified product having carboxyl groups on side chains, polyethyleneoxide or polyvinylpyrrolidone, may, for example, be mentioned. For the purpose of improving the film strength and adhesive properties, a polyether of epichlorohydrin with bisphenol A; a soluble nylon; a polyalkyl methacrylate such as polymethyl methacrylate or a polyalkyl acrylate; a copolymer of an alkyl methacrylate with acrylonitrile, acrylic acid, methacrylic acid, vinyl chloride, vinylidene chloride or styrene; a copolymer of acrylonitrile with vinyl chloride or vinylidene chloride; a copolymer of vinyl acetate with vinylidene chloride, polyolefin chloride or vinyl chloride; polyvinyl acetate; a copolymer of acrylonitrile with styrene; a copolymer of acrylonitrile with butadiene and styrene; a polyvinylalkyl ether; a polyvinylalkyl ketone; a polystyrene; a polyamide; a polyurethane; a polyethylene terephthalate isophthalate; acetylcellulose; and polyvinylbutyral, may, for example, be mentioned. Such a binder can be incorporated preferably in an amount of not higher than 500%, more preferably not higher than 200%, by weight relative to the above ethylenic compound.

To the photopolymerizable composition of the present invention, a thermal polymerization inhibitor, a coloring agent, a plasticizer, a surface protecting agent, a lubricant, a coating assistant and other additives may further be incorporated, as the case requires.

The thermal polymerization inhibitor includes, for example, hydroquinone, p-methoxyphenol, pyrogallol, catechol, 2,6-di-butyl-p-cresol and β-naphthol. The coloring agent includes, for example, a pigment such as phthalocyanine pigment, azo pigment, carbon black or titanium oxide, ethyl violet, crystal violet, an azo dye, an anthraquinone dye and a cyanine dye. The amounts of such thermal polymerization inhibitor and coloring agent are preferably from 0.01 to 3% by weight of the thermal polymerization inhibitor and from 0.1 to 20% by weight of the coloring agent relative to the total weight of the ethylenic compound and the binder, when the binder is used.

The above plasticizer may, for example, dioctyl phthalate, didodecyl phthalate, triethylene glycol dicaprylate, dimethyl glycol phthalate, tricresyl phosphate, diocthyl adipate, dibutyl sebacate or triacetyl glycerol. When a binder is used, such a plasticizer may be added in an amount of not more than 20% relative to the total weight of the ethylenic compound and the binder.

The photopolymerizable composition of the present invention can be applied to a color image reproducing technique as disclosed in e.g. Japanese Examined Patent Publication No. 41346/1971, wherein a photosensitive layer is formed by coating three layers of gelatin films in which photopolymerizable compositions in a droplet shape containing color couplers and photopolymerizable initiators corresponding to blue, green and red colors, are dispersed, respectively, then color image light rays are irradiated, followed by treatment with color forming developers so that non-cured portions undergo color development to form a full color image.

When the photopolymerizable composition of the present invention is applied to the technique for reproducing a color image, a colorant precursor such as a color-forming material used in a conventional color photographic film as disclosed in Japanese Examined Patent Publication No. 41346/1971 or a leuco colorant well known in the technical field of pressure sensitive copying paper, may be incorporated. The leuco colorant includes, for example, a triarylmethane, a bisarylmethane, a xanthene compound, a fluoran, a thiazine compound and compounds having a lactone, lactum, sultone or spiropyran structure as a part of their structures. When such a colorant precursor is used, its amount is preferably not more than 40% by weight relative to the total weight of the ethylenic compound and the binder.

When the photopolymerizable composition of the present invention is used, it may be formed into a photosensitive material without using any solvent, or it may be dissolved in a suitable solvent to obtain a coating solution, which is coated on a support, followed by drying to obtain a photosensitive material. The solvent may, for example, be methyl ethyl ketone, cyclohexanone, butyl acetate, amyl acetate, ethyl propionate, toluene, xylene, monochlorobenzene, carbon tetrachloride, trichloroethylene, trichloroethane, dimethylformamide, methylcellusolve, ethylcellusolve, tetrahydrofuran and bentoxone.

Any commonly employed support may be used as the support to be used for the preparation of the photosensitive material employing the photopolymerizable composition of the present invention. For example, it may be a sheet of metal such as aluminum, magnesium, copper, zinc, chromium, nickel or iron, or an alloy composed mainly of such a metal; a paper sheet such as high quality paper, art paper or releasing paper; an inorganic sheet made of e.g. glass or ceramics; a polymer sheet made of e.g. polyethylene terephthalate, polyethylene, polymethyl methacrylate, polyvinyl chloride, a vinyl chloride-vinylidene chloride copolymer, polystyrene, 6-nylon, cellulose triacetate or cellulose acetate butylate.

Further, in order to prevent adverse effects such as a deterioration in the sensitivity or a deterioration in the storage stability due to oxygen, a conventional technique may be applied to the photopolymerizable composition of the present invention, for example, by providing a peelable transparent cover sheet on the photosensitive layer, or by providing a coating layer by means of a wax-like material or a water-soluble polymer having a low oxygen permeability.

There is no particular restriction as to the light source for radiation applicable to the composition of the present invention. A commonly employed light source containing visual light rays of at least 400 nm may suitably be used, such as a carbon arc, a high pressure mercury lamp, a xenone lamp, a metal halide lamp, a fluorescent lamp, a tungsten lamp, a helium-cadominium laser or an argon ion laser.

Now, the present invention will be described in further detail with reference to Preparation Examples, Working Examples and Comparative Examples. However, it should be understood that the present invention is by no means restricted by these specific Examples.

Among the abbreviations for the sensitizers and the active agents disclosed hereinafter, r-1 indicates 2,4-bis (trichloromethyl)-6-(p-dimethylaminostyryl)-1,3,5-triazine as the compound disclosed in the above-mentioned Japanese Examined Patent Publication No. 1281/1984. Other abbreviations are as explained above in this specification. The amounts indicated by % are % by weight to the total weight of the ethylenic compound and the binder.

PREPARATION EXAMPLE 1

(Preparation of Sensitizer a-5)

2.6 g of 2,4,6-trismethyl-1,3,5-triazine and 3.2 g of julolidine-9-carbaldehyde were added and mixed to a solvent mixture comprising 0.6 g of potassium hydroxide, 4 cc of water and 13 cc of ethanol, and the mixture was reacted for 3 hours in a bath of 80° C. To the reaction mixture thus obtained, water was added, and the solid content was separated and recrystallized from a solvent mixture of ethanol/water to obtain reddish brown crystals (mp 170° C.).

Molecular weight:

calculated value 306 analyzed value 306 (by mass spectral method)

PREPARATION EXAMPLE 2

(Preparation of Sensitizer a-6)

2.5 g of 2,4-bisphenyl-6-methyl-1,3,5-triazine and 2.1 g of julolidine-9-carbaldehyde were gradually added and mixed under cooling with ice to 25 g of concentrated sulfuric acid. The reaction mixture was left to stand at room temperature for 44 hours, then put into water and neutralized with sodium carbonate. Obtained crystals were washed with methanol and recrystallized from hot acetone to obtain reddish brown crystals (mp 210° C.).

Molecular weight:

calculated value 430 analyzed value 430 (by mass spectral method)

EXAMPLES 1 TO 12 AND COMPARATIVE EXAMPLES 1 TO 5

10 g of a methyl methacrylate/methacrylic acid copolymer (weight average molecular weight: 45,000, copolymerization ratio of 85/15), 10 g of trimethylol propane triacrylate and 60 mg of Victoria Pure Blue BOH were dissolved in 180 g of methyl ethyl ketone to obtain a photosensitive stock solution. This stock solution was divided. To each solution, the sensitizer and the active agent as identified in Table 1 were dissolved in prescribed amounts to obtain a photosensitive solution. Each photosensitive solution was whirl-coated on a grained and anodized aluminum sheet so that the dried film thickness would be 2.5 μm, followed by drying at 70° C. for 5 minutes. On this surface, an aqueous polyvinyl alcohol solution was further coated to form an overcoat layer having a dried film thickness of 3 μm, whereby a photosensitive test sample was obtained. Then, the sample was exposed by Grating Spectrograph RM-23 (manufactured by Narumi) and then developed by an aqueous solution containing 9% by weight of butylcellusolve and 1% by weight of sodium silicate. From the obtained spectral cured image, the sensitivity to light rays of 488 nm was obtained. The results are shown in Table 1, wherein the sensitivity is represented by the energy required for photocuring.

TABLE 1

| | Sensitizer (amount) | Active agent (amount) | Sensitivity (mj/cm$^2$) |
|---|---|---|---|
| Example 1 | a-1 (1%) | b-3 (15%), b-5 (5%) | 0.47 |
| Example 2 | a-4 (1%) | b-3 (15%), b-5 (5%) | 0.16 |
| Example 3 | a-5 (1%) | b-3 (15%), b-5 (5%) | 0.13 |
| Example 4 | a-6 (1%) | b-3 (15%), b-5 (5%) | 0.12 |
| Example 5 | a-7 (1%) | b-3 (15%), b-5 (5%) | 1.7 |
| Example 6 | a-8 (1%) | b-3 (15%), b-5 (5%) | 0.30 |
| Example 7 | a-12 (1%) | b-3 (15%), b-5 (5%) | 0.12 |
| Example 8 | a-19 (1%) | b-3 (15%), b-5 (5%) | 0.14 |
| Example 9 | a-20 (1%) | b-3 (15%), b-5 (5%) | 0.21 |
| Example 10 | a-21 (1%) | b-3 (15%), b-5 (5%) | 0.21 |
| Example 11 | a-22 (1%) | b-3 (15%), b-5 (5%) | 0.14 |
| Example 12 | a-23 (1%) | b-3 (15%), b-5 (5%) | 0.35 |
| Comparative Example 1 | a-5 (1%) | — | >20 |
| Comparative Example 2 | a-5 (1%) | — | >20 |
| Comparative Example 3 | — | b-3 (15%), b-5 (5%) | >20 |
| Comparative Example 4 | r-1 (1%) | — | >20 |
| Comparative Example 5 | r-1 (1%) | b-3 (15%), b-5 (5%) | >20 |

EXAMPLES 13 to 17

The evaluation was conducted under the same conditions as in Example 3 except that the active agent was changed to the one shown in Table 2. The results are shown in Table 2.

TABLE 2

|  | Active agent (amount) | Sensitivity (mj/cm$^2$) |
|---|---|---|
| Example 13 | b-1 (5%) | 0.61 |
| Example 14 | b-2 (5%) | 0.55 |
| Example 15 | b-4 (5%) | 2.3 |
| Example 16 | b-6 (5%) | 4.2 |
| Example 17 | b-7 (5%) | 1.9 |

The photopolymerizable composition of the present invention has high sensitivity to visible light rays, particularly to light rays with a long wavelength of 488 nm.

We claim:

1. A photopolymerizable composition comprising an addition polymerizable compound having at least one ethylenically unsaturated double bond and a photopolymerization initiator system, wherein the photopolymerization initiator system comprises:

(a) a sensitizer of the formula (I)

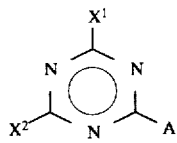

(I)

wherein -A is

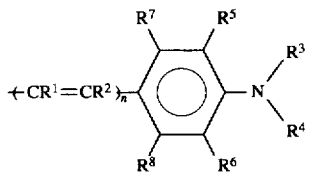

wherein each of R$^1$ and R$^2$ is a hydrogen atom, an alkyl group, an aryl group or a halogen atom, each of R$^3$ and R$^4$ is an alkyl group which may have substituents, each of R$^5$ to R$^8$ is a hydrogen atom, an alkyl group or an alkoxy group, or R$^3$ and R$^4$, R$^3$ and R$^5$ and/or R$^4$ and R$^6$ bond to each other to form a ring structure, and n is 1 or 2; and each of X$^1$ and X$^2$ is -A as defined above, an alkyl group, an aralkyl group, an aryl group, a heterocyclic group, an alkoxy group, an aryloxy group, a carboalkoxy group, an amino group or an unsubstituted vinyl group; and (b) at least one active agent capable of generating active radicals when irradiated in the co-existence of the sensitizer.

2. The photopolymerizable composition according to claim 1, wherein the addition polymerizable compound having at least one ethylenically unsaturated double bond, is an ethylenically unsaturated carboxylic acid ester.

3. The photopolymerizable composition according to claim 1, wherein the addition polymerizable compound having at least one ethylenically unsaturated double bond, is a monomer of an acrylic acid ester or a methacrylic acid ester.

4. The photopolymerizable composition according to claim 1, wherein substituent -A in the formula (I) has a tetrahydroquinoline ring.

5. The photopolymerizable composition according to claim 1, wherein substituent -A in the formula (I) has a julolidine ring.

6. The photopolymerizable composition according to claim 1, wherein the active agent capable of generating active radicals is a hexaarylbiimidazole.

7. The photopolymerizable composition according to claim 1, which contains from 0.05 to 20 parts by weight of the sensitizer of the formula (I) and from 0.5 to 70 parts by weight of the active agent capable of generating active radicals, per 100 parts by weight of the addition polymerizable compound having at least one ethylenically unsaturated double bond.

8. The photopolymerizable composition according to claim 1, which contains from 0.2 to 10 parts by weight of the sensitizer of the formula (I) and from 1 to 30 parts by weight of the active agent capable of generating active radicals, per 100 parts by weight of the addition polymerizable compound having at least one ethylenically unsaturated double bond.

9. The photopolymerizable composition according to claim 1, which further contains an organic polymer compound.

10. The photopolymerizable composition according to claim 1, which further contains at least one member selected from the group consisting of a thermal polymerization inhibitor, a coloring agent and a plasticizer.

11. The photopolymerizable composition according to claim 1, which further contains a colorant precursor.

12. The photopolymerizable composition according to claim 1, wherein the active agent capable of generating active radicals is at least one member selected from the group consisting of hexaarylbiimidazoles, 2,4,6-tris(trichloromethyl)-s-triazine, 2,4,6-tris(tribromomethyl)-s-triazine, 2-methyl-4,6-di(trichloromethyl)-s-triazine, 2-(p-methoxyphenyl)-4,6-di(trichloromethyl)-s-triazine, 2,2,2-trichloromethylacetophenone, tribromomethylphenylsulfone, 2-trichloromethyl-5-(p-methoxystyryl)-1,3,4-oxadiazole, organic thiol compounds, diaryliodonium salts, ketoxime esters, organic peroxides, N-phenylglycine and dimedone.

* * * * *